US006498385B1

(12) United States Patent
Daubenspeck et al.

(10) Patent No.: US 6,498,385 B1
(45) Date of Patent: Dec. 24, 2002

(54) POST-FUSE BLOW CORROSION PREVENTION STRUCTURE FOR COPPER FUSES

(75) Inventors: Timothy H. Daubenspeck, Colchester, VT (US); Daniel C. Edelstein, New Rochelle, NY (US); Robert M. Geffken, Burlington, VT (US); William T. Motsiff, Essex Junction, VT (US); Anthony K. Stamper, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/388,314

(22) Filed: Sep. 1, 1999

(51) Int. Cl.[7] .............................................. H01L 29/00

(52) U.S. Cl. ...................... 257/529; 257/536; 257/537; 257/758; 257/762

(58) Field of Search ................................ 257/529, 536, 257/537, 538, 762, 758, 759, 760, 768, 769, 770, 761

(56) References Cited

U.S. PATENT DOCUMENTS

| 4,826,785 A | | 5/1989 | McClure et al. |
| 4,948,747 A | * | 8/1990 | Pfiester .......................... 437/60 |
| 5,070,392 A | * | 12/1991 | Coffey et al. ................ 357/712 |
| 5,152,869 A | | 10/1992 | Perraris |
| 5,169,802 A | | 12/1992 | Yeh |

(List continued on next page.)

FOREIGN PATENT DOCUMENTS

| EP | 0-0751-566 A2 | 1/1997 |

OTHER PUBLICATIONS

C.-K. Hu et al., "Diffusion Barrier Studies for Cu," Jun. 9–10, 1986, IEEE VLSI Multilevel Interconnection Conf., pp. 181–187.

J.E. Cronin et al. "Optimum Metal Line Structures for Memory Array and support Circuits," May, 1988, IBM Tech. Disc. Bulletin, vol. 30, No. 12, pp. 170–171.

K. B. Albaugh et al. "Fuse Structure for Wide Fuse Materials Choice," Aug. 1989, IBM Tech. Disc. Bulletin, vol. 32, No. 3A, pp. 438–439.

(List continued on next page.)

Primary Examiner—Sara Crane
(74) Attorney, Agent, or Firm—William D. Sabo

(57) ABSTRACT

A structure and method of fabricating a semiconductor corrosion resistant metal fuse line including a refractory liner which can also act as a resistor is disclosed. Fabrication is accomplished using damascene process. The metal structure can be formed on a semiconductor substrate including a first portion including a first layer and a second layer, the first layer having higher resistivity than the second layer, the second layer having horizontal and vertical surfaces that are in contact with the first layer in the first portion, and a second portion coupled to the first portion, the second portion being comprised of the first layer, the first layer not being in contact with the horizontal and vertical surfaces of the second layer in the second portion. The metal structure can be used as a corrosion resistant fuse. The metal structure can also be used as a resistive element.

The high voltage tolerant resistor structure allows for usage in mixed-voltage, and mixed signal and analog/digital applications. The resistor element has low capacitance, low skin effect, high linearity, a high melting temperature, and a high critical current to failure. The resistor structure can be formed on the walls of a dielectric trough. The structure can be applied to circuit applications such as an ESD network, an RC-coupled MOSFET, a resistor ballasted MOSFET and others. The resistors can be in series with the MOSFET or other structures.

11 Claims, 12 Drawing Sheets

U.S. PATENT DOCUMENTS

| | | | | | |
|---|---|---|---|---|---|
| 5,244,836 | A | * | 9/1993 | Lim | 437/192 |
| 5,266,446 | A | | 11/1993 | Chang et al. | |
| 5,281,485 | A | | 1/1994 | Colgan et al. | |
| 5,352,923 | A | * | 10/1994 | Boyd et al. | 257/636 |
| 5,420,455 | A | | 5/1995 | Gilmour et al. | |
| 5,602,408 | A | * | 2/1997 | Watanabe et al. | 257/350 |
| 5,627,400 | A | * | 5/1997 | Koga | 257/529 |
| 5,663,590 | A | * | 9/1997 | Kapoor | 257/529 |
| 5,665,629 | A | * | 9/1997 | Chen et al. | 438/384 |
| 5,731,624 | A | | 3/1998 | Motsiff et al. | |
| 5,760,674 | A | | 6/1998 | Gilmour et al. | |

OTHER PUBLICATIONS

C.-K. Hu et al., "Copper–Polyimide Wiring Technology for VLSI Circuits," 1990, Mat. Res. Soc. Symp. Proc. VLSI V, pp. 369–373.

J.E. Cronin et al. "Method to Incorporate Three Sets of Pattern Information in Two Photo–Masking Steps," Jan., 1990, IBM Disclosure Bulletin, vol. 32, No. 8A.

D. Edelstein, et al., "Full Copper Wiring in a Sub–0.25um CMOS ULSI Technology", Jul., 1997, pp. 773–776, IEEE.

\* cited by examiner

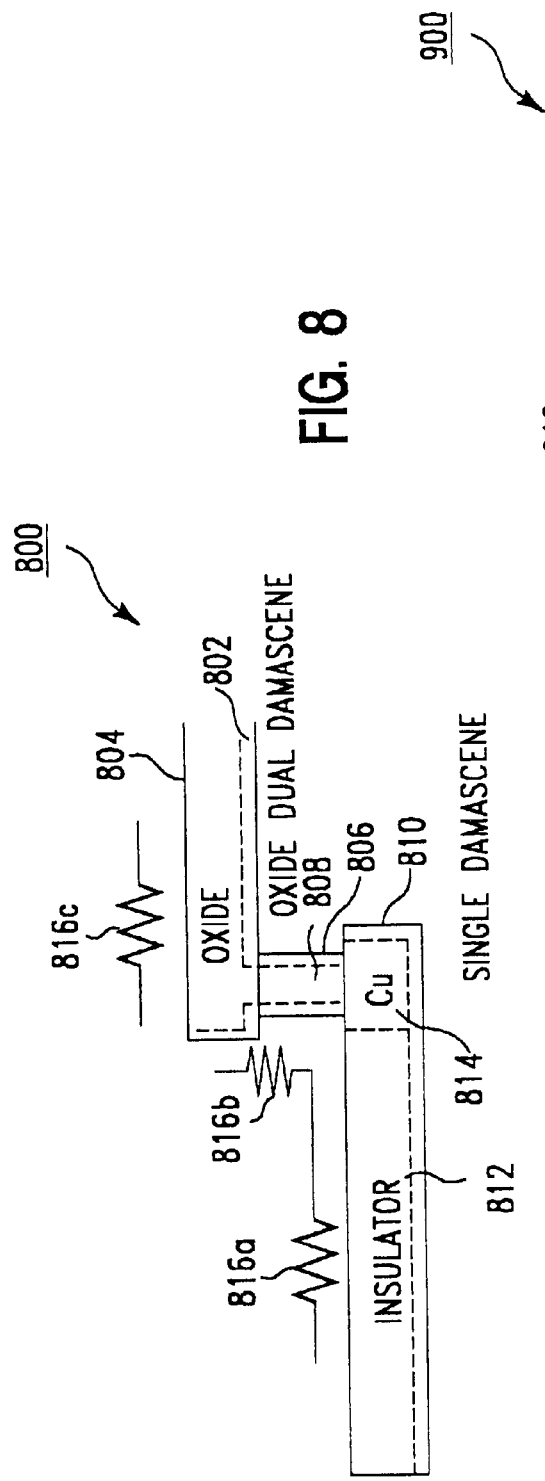
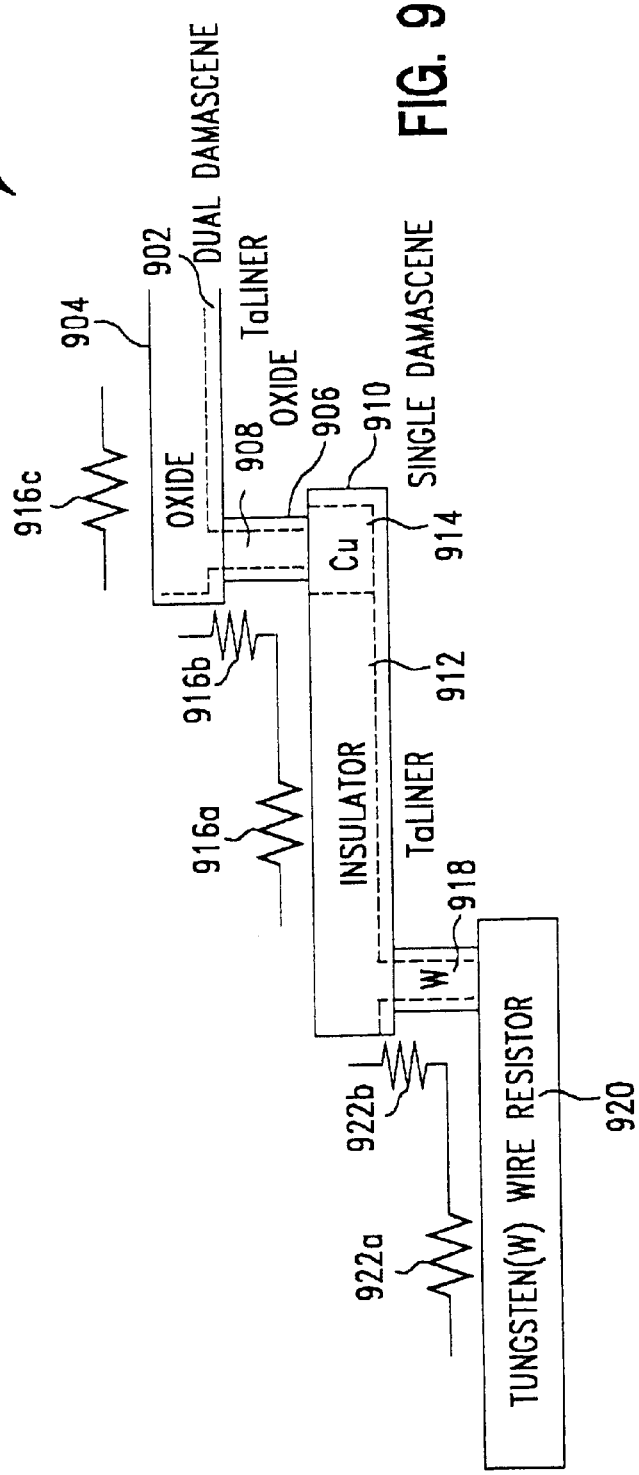

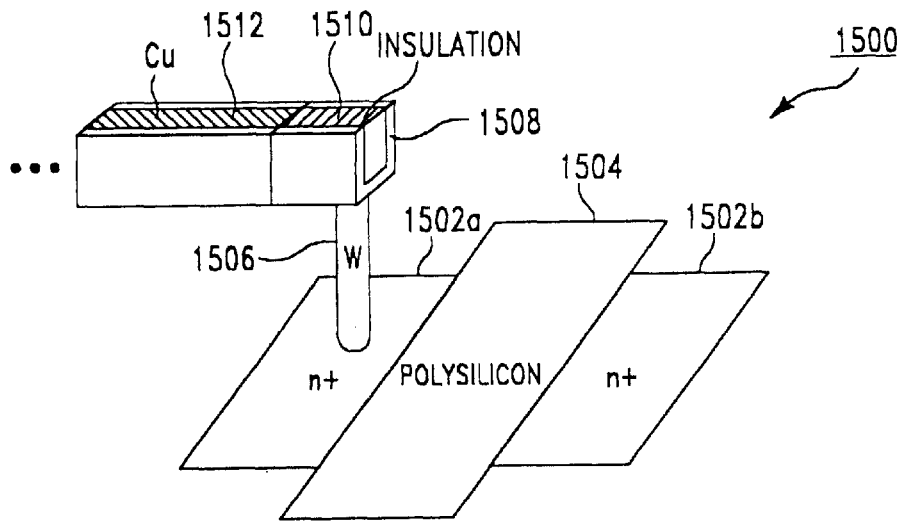
FIG. 15A
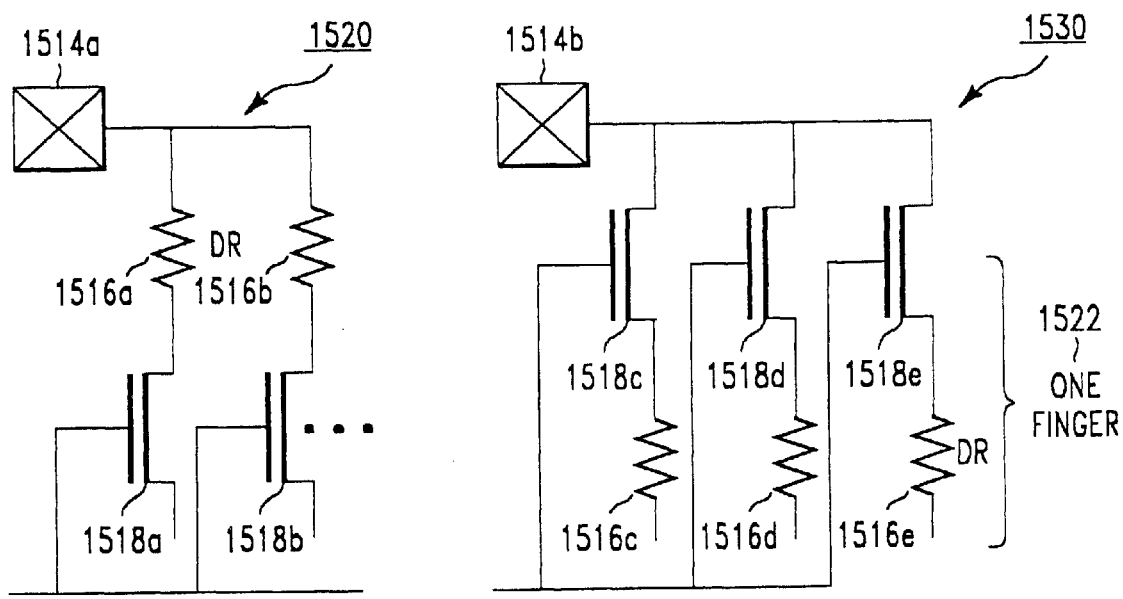
FIG. 15B              FIG. 15C

POST-FUSE BLOW CORROSION PREVENTION STRUCTURE FOR COPPER FUSES

BACKGROUND OF THE INVENTION

1. Field of the Invention

The present invention relates to semiconductor integrated circuit (IC) chips which can be tailored to produce a fuse. The invention further relates to a method of making an improved non-corrosive resistive structure.

2. Related Art

Fuses can be used in semiconductor chips to provide redundancy, electrical chip identification and customization of function. For designs having three (or more) layers of wiring, the fuses are typically formed from a segment of one of the wiring layers, e.g., the "last metal" (LM) or "last metal minus one" (LM−1) wiring layer. Fusing, i.e., the deletion of a segment of metal fuse line, is accomplished by exposing the segment of metal fuse line to a short, high intensity pulse of "light" from an infra-red (IR) laser. The metal line absorbs energy, melts and expands, and ruptures any overlain passivation layer. The molten metal then boils or vaporizes out of its oxide surroundings, disrupting line continuity and causing high electrical resistance. Metals exposed by this laser deletion process can corrode possibly leading to undesirable reconnection of a fuse link.

Semiconductor integrated circuits are formed in a body of semiconductor material having active regions which are joined in a desired circuit configuration by a plurality of wiring layers laid down on the surface of the body.

In the manufacture of the circuits, wiring layers are deposited and defined and interconnected with conductive vias through a series of well known photolithography and metal etching steps. Each such wiring level can be coated with a layer of a glassy protective material, known as a passivation layer, which protects and insulates the wiring of each layer. The creation of integrated circuits with such multiple wiring layers is well known to the semiconductor art.

In some circuits, such as, e.g., CMOS logic circuits, the fuses designed in the circuit are often formed in regular arrays in the upper most layers of wiring and in a position such that other wiring is not placed immediately over the fuses. In such arrays the fuses are often aligned in parallel rows and placed as closely together as is possible. By opening selected ones of these fuses the logic elements of the circuits can be arranged in different combinations to perform different logic functions.

These fuses are typically opened by applying a laser pulse of sufficient size, duration and power as to superheat and vaporize the metal forming the fuse. This superheating of the fuse and its vaporization fractures and blows away a portion of the overlying glassy protective layer creating a saucer shaped crater in the protective layer. When the protective layer ruptures, cracks can radiate outwardly causing additional damage such as breakage of or the uncovering of adjacent elements. Such uncovering of the adjacent elements can cause subsequent corrosion and premature failure of the circuit.

It is desirable that in future generation integrated circuits, such as, e.g., sub-0.25 $\mu$m complimentary metal oxide semiconductor (CMOS) back end of line (BEOL), that copper (Cu) wiring be employed to meet BEOL resistor capacitor (RC) delay performance requirements. During stressing of copper fuses, such as under conditions of, e.g., in 85 degrees celsius (C) temperature, 85% relative humidity with electrical bias stressing, copper fuses can corrode. This corrosion may extend through multiple via levels if a Tantalum Nitride/Tantalum (TaN/Ta) liner does not act as a corrosion stop. The byproduct of this corrosion can completely cover the blown fuse area which can create an undesirable resistive leakage path between blown fuses. Known methods of reducing or eliminating this defect include using aluminum wiring and passivating the copper fuse after fuseblow. However, adding an aluminum wiring level reduces the electrical performance of the device and adding a passivation layer after fuseblow increases cost and complexity. An improved method to reduce or eliminate corrosion of exposed copper wiring is desired.

The reader is referred to the following patents related to fuses including:

"Fusible Links with Improved Interconnect Structure," U.S. Pat. No. 5,760,674;

"Array Fuse Damage Protection Devices and Fabrication Method," U.S. Pat. No. 5,420,455, to Richard A. Gilmour, et al.;

"Integrated Pad and Fuse Structure for Planar Copper Metallurgy," U.S. Pat. No. 5,731,624, to William T. Motsiff, et al.;

"Method of making a multilayer thin film structure," U.S. Pat. No. 5,266,446, to Kenneth Chang, et al.; the contents of which are incorporated herein by reference in their entirety.

The reader is also referred to several articles, published patent documents and patents:

Anon., "Fuse Structure for Wide Fuse Materials Choice," IBM Technical Disclosure Bulletin, Vol. 32, No. 3A, August 1989, pp. 438–439;

Anon., "Optimum Metal Line Structures for Memory Array and Support Circuits," IBM Technical Disclosure Bulletin, Vol. 30, No. May 12, 1988, pp. 218–219;

Anon., "Method to Incorporate Three Sets of Pattern Information in Two Photo-Masking Steps," IBM Technical Disclosure Bulletin, Vol. 32, No. 8A, January 1990, pp. 170–171;

"Structure and Method of Making Alpha-Ta in Thin Films," U.S. Pat. No. 5,281,485 to E. G. Colgan;

European Published Application EP 751566 A2, "A Thin-Film Metal Barrier for Electrical Connections," to C. Cabral er al.

C. K. Hu et al., "Diffusion Barrier Studies for Cu," Proc. V-MIC, 1986, pp. 181–187;

C. H. HU et al., "Copper-Polyimide Wiring Technology for VLSI Circuits," Proc. Material Research soc., 1990, pp. 369–373; and D. Edelstein et al., "Full Coper Wiring in a Sub-0.25 $\mu$m CMOS ULSI Technology," Tech. Dig. IEEE Int. Electr. Dev. Mtg. 1997, pp. 773–776, the contents of which are incorporated herein by reference in their entirety.

Resistor elements are important for peripheral and internal circuits. Resistor elements can be used in internal circuits in, e.g., voltage regulators, reference bias circuits, and other applications. Resistor elements can be used in peripheral circuits in receiver and driver circuits for impedance matching, noise/ring-back dampening, resistor ballasting, overvoltage dampening and other applications. In electrostatic discharge (ESD) networks, resistors can be used in resistor capacitor (RC) coupled n-type field effect transistors (NFETs), integrated with metal oxide semiconductor FETs (MOSFETs) for resistor ballasting, and a plurality of other applications.

Many materials used as resistors are good in a functional regime but inadequate for ESD robustness or precision linear applications. Diffused resistors are commonly used in circuit applications, yet can have many disadvantages. Polysilicon film resistors, and diffused implanted resistors can have many concerns in high voltage and high current regimes. N-well, n-diffusion and buried resistors (BR) can be used in many circuit applications. Polysilicon resistors can also have reliability concerns. Polysilicon resistors can exhibit a "spaghetti effect" at high voltage stress. Under high voltage stress, polysilicon resistors can have a tendency to change resistance values causing misfunction of circuit and ESD applications.

N-well, n-diffusion and buried resistors (BR) can be used in many circuit applications. Diffused resistors can add extra capacitance to a circuit. This extra capacitance can be disadvantageous to receiver performance and driver capacitance loading. For analog, radio frequency CMOS and high performance applications, capacitance can be a concern. Diffused resistors can also be involved in ringing phenomenon (ring-back), undershoot phenomena, and latchup. For solid state transistor logic (SSTL) circuit applications where "critical dampening" is needed, e.g., in input/output (I/O) circuits, diffused elements can be detrimental to the ringing as they pass current in negative undershoot. N-well, n-diffusion, and buried resistors (BRs) can also form a parasitic npn structure that can create unwanted ESD and functional parasitic devices. As a result, ground rules can be expanded to address these parasitic devices. The resistor elements can become a large percentage of the I/O circuit area between the physical structure and the ground rule spaces required. Diffused resistors can also have charged device model (CDM) concerns. In a CDM test mode, for example, diffused resistors can be actively involved, leading to unwanted parasitic devices. What is needed then, is a resistor that has low capacitance, high resistance, high linearity with voltage and temperature, is physically small, and has a high melting temperature. It is also desired that the improved resistor not interact with a silicon surface of a substrate. It is desirable that the resistive element be usable in applications requiring insensitivity to voltage stressing, electrical overstress (EOS), and electrostatic discharge (ESD) phenomenon.

SUMMARY OF THE INVENTION

A metal structure formed on a semiconductor substrate including a first portion including a lower layer and an upper layer, the lower layer having a higher electrical resistivity than the upper layer, the upper layer having horizontal and vertical surfaces that are in contact with the lower layer in the first portion, and a second portion coupled to the first portion, the second portion being comprised of the lower layer, the lower layer not being in contact with the horizontal and vertical surfaces of the upper layer in the second portion. The metal structure can be used as a corrosion resistant fuse. The metal structure can also be used as a resistive element.

The present invention can include a method of fabricating a corrosion resistant fuse including the steps of lithographically patterning, etching, depositing a refractory liner (which can act as a resistor), depositing copper and using chemical mechanical polishing (CMP) to damascene a last metal (LM) wiring level and fuses, lithographically patterning one or more openings over the fuse, removing exposed copper using an etchant that is selective to copper and does not attack the liner, such as, e.g., aqueous ammonium persulfate, or a mixture of sulfuric acid, hydrogen peroxide, and water, removing resist and depositing final passivation films; completing processing defining terminal metal contact holes in final passivation films, and electrically testing and laser deleting the fuse, wherein the fuse is comprised of at least one of a segment of liner and a segment of the copper LM line isolated on at least one side by a "liner only" structure.

An advantage of the present invention is that the laser deleted region is isolated from the remainder of the copper circuitry by links of fully passivated, corrosion resistant refractory material, such as, e.g., TaN/Ta. In one embodiment of the invention, the fuse can be a portion of the TaN/Ta link, and in another embodiment, the fuse can be an appropriately sized portion of a TaN/Ta/Cu line which is adjacent to the TaN/Ta links. The structure of the present invention intrinsically eliminates the possibility of spreading of deleted fuse associated corrosion into the chip wiring or bridging of the deleted region.

Another advantageous feature of the present invention is that the fully passivated, corrosion resistant refractory material, such as, e.g., TaN/Ta links can be used as resistors. The resistor structure has low capacitance, high resistance, high linearity with temperature and voltage, is physically small, and has a high melting temperature.

An advantage of a back end of line resistor (BEOL) with high melting melting temperatures, provided by refractory metals is that it provides electrostatic discharge (ESD) protection.

The power to failure ($P_f/A$) of an interconnect is proportional to the square root of the thermal conductivity (K), the heat capacity ($C_p$), and the mass density ($\rho$), times the melting temperature of the interconnect ($T_{melting}$), divided by the pulse width ($\tau^{1/2}$), see equation 1, below. Material (i.e., wire) that has a higher melting temperature will be more robust from over voltage and over current protection as well as ESD phenomena.

$$\frac{P_f}{A} = \frac{\sqrt{K\rho C_p} \, (T_{melting} - T_{ambient})}{\tau^{1/2}} \quad (1)$$

Having resistors in series with sensitive circuits can also be advantageous to prevent over voltage of the peripheral circuits in a semiconductor chip.

This invention is a resistor structure placed between the pads and the ESD device. The device can also be physically a fuse.

A feature of the invention provides a structure, a method and circuit applications for applications which desire insensitivity to voltage stress, electrical overstress (EOS) and electrostatic discharge (ESD) phenomena.

Another feature of the resistor element of the invention is that it can be used for mixed voltage, analog/digital and mixed signal applications.

Another feature of the resistor element of the invention, if using a back end of line (BEOL) resistor, is that the resistor also has low capacitance, so that if it is in a low capacitance material or silicon dioxide, it has significantly lower capacitance than silicon based resistor structures.

Thus, another feature of the invention uses the interconnect as a resistor as well. Another feature of the resistor is as the interconnect temperature increases, the resistance increases, (e.g., $R(T)=R_o (1+\alpha T)$) increasing the ballasting at high currents. Yet another advantage of Ta, particularly α-Ta, is that reasonably sized resistors, such as, e.g., 50 ohm resistors, can be formed.

The typical resistor can be used for impedance matching, and for resistor ballasting. The resistor ballasting concept takes a multi-finger element and digitate it into multiple elements and put resistors in parallel. The invention can provide resistor ballasting in a multi-element cell which allows, when the resistors are placed in parallel, to place resistors of significantly higher value to prevent electrical overload in one of the sub cells.

A feature of the resistor element of the invention is that it has very low skin effect concerns for high frequency applications.

Another feature of the invention provides a resistor element having a high critical current-density-to-failure ($J_{crit}$)

A method of forming the resistor structure can include a damascene process. The resistor is consistent with the manner in which damascene structures are formed. For example, in copper by using a trough, followed by a refractory metal deposition. An embodiment of the invention forms a resistor element using a single damascene process. Another embodiment includes a single damascene process where the resistor includes a trough. Another embodiment includes a single damascene process where the resistor includes a trough, a tungsten (W) contact, and a W film trough. An embodiment of the invention forms a resistor element using a dual-damascene process. Another embodiment includes a dual-damascene process where the resistor includes a trough and a via. Another embodiment includes a dual-damascene process where the resistor includes a trough, a via and a second trough. Another embodiment includes a dual-damascene process where the resistor includes a trough, a via and a second trough, a W contact and a W film trough.

An example method of the present invention includes the steps of forming a resistor by a damascene process, including defining a trough, depositing a highly resistive film, depositing a second film, polishing, and etching out the second film to obtain a resistor structure. In one embodiment of the invention, the first film can be tantalum, α-Ta, tantalum nitride, or another liner/diffusion barrier material. In another embodiment of the invention, the second film can be a conductive film such as, e.g., copper.

Another example method of the present invention includes the steps of forming a resistor by a dual-damascene process, including defining a trough and via, depositing a highly resistive film, depositing a second film, polishing, and etching out the second film to obtain a resistor structure. In one embodiment of the invention, the first film can be tantalum, tantalum nitride, or another liner/diffusion barrier material. In another embodiment of the invention, the second film can be a conductive film such as, e.g., copper.

An example method of the present invention includes the steps of forming a resistor by a damascene process, including defining a trough, depositing a highly resistive film, depositing a dielectric film and polishing to obtain a resistor structure. In one embodiment of the invention, the highly resistive film can be tantalum, α-Ta, tantalum nitride, or another liner/diffusion barrier material.

Another example method of the present invention includes the steps of forming a resistor by a dual-damascene process, including defining a trough and via, depositing a highly resistive film, depositing a dielectric film, and polishing to obtain a resistor structure. In one embodiment of the invention, the first film can be tantalum, tantalum nitride, or another liner/diffusion barrier material.

In one embodiment of the invention, the resistor structure can be a single trough. In another, the resistor structure can include a single trough and a via. In another embodiment, the resistor structure can include a single trough, via and W contact. In yet another, the resistor can include a single trough, via, trough, W via, and W film. In another embodiment a resistor structure can include a plurality of these exemplary resistive elements.

Further features and advantages of the invention, as well as the structure and operation of various embodiments of the invention, are described in detail below with reference to the accompanying drawings.

BRIEF DESCRIPTION OF THE DRAWINGS.

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

FIG. 8 depicts a cross-sectional view of a dual-damascene resistor structure comprising a trough, a via hole and a single damascene single trough of the present invention;

FIG. 9 depicts a cross-sectional view of a dual-damascene resistor structure comprising a trough, a via hole, a single damascene single trough, a tungsten (W) via and W film of the present invention;

FIG. 15 illustrates an example circuit depicting a W contact in contact with a MOSFET according to the present invention.

DETAILED DESCRIPTION OF THE INVENTION

Figure 1A:
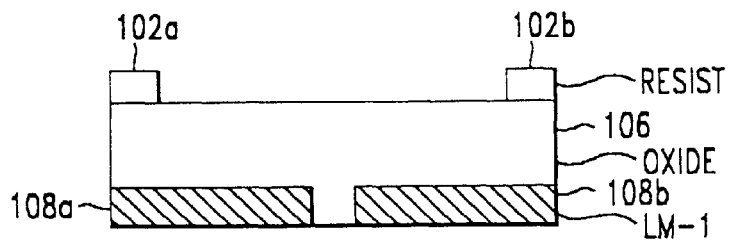
FIGS. 1A through 1G depict a cross-section of an integrated circuit during fabrication of the metal structure of the present invention.

The preferred embodiment of the invention is discussed in detail below. While specific implementations are discussed, it should be understood that this is done for illustration purposes only. A person skilled in the relevant art will recognize that other components and configurations may be used without departing from the spirit and scope of the claimed invention.

Overview of Present Invention

Laser delete of metal fuses can result in corrosion of wiring conductors near the fuses. A section of last metal (LM) line is formed which is left intact in an unblown fuse and is removed in a blown fuse, in order to provide a high resistance. A blown copper wiring fuse can cause corrosion by interrupting or removing a copper portion of a nearby wiring conductor. A fuse can be blown by shining an infrared (IR) laser on the metal line. The present invention eliminates the possibility of the blown copper wiring fuses corroding by interrupting and/or removing the copper portion of the wiring conductor in the area between a fuse link and a remaining portion of wiring. Copper (Cu) can be removed before a final passivation layer is deposited on the wafer and last metal (LM) bond pads are opened. Prior to laser deletion, the fuse link can remain electrically connected to the rest of the circuitry by means of a corrosion resistant Tantalum Nitride Tantalum (TaN/Ta) liner that is deposited prior to copper deposition and damascene metal fill.

An exemplary fabrication sequence for forming a refractory element barrier to fuse corrosion regrowth can include the following steps:

1. lithographically patterning, etching, depositing a TaN/Ta liner, depositing copper and using chemical mechanical polishing (CMP) to damascene a last metal (LM) wiring level and fuses;
2. lithographically patterning one or more openings over the fuse;
3. removing exposed copper using an etchant that is selective to copper and does not attack the liner, such as, e.g. aqueous ammonium persulfate or a dilute mixture of sulfuric acid and hydrogen peroxide;
4. removing resist and depositing final passivation films; completing processing defining terminal metal contact holes in final passivation films; and
5. electrically testing and laser deleting the fuse, wherein the fuse is comprised of at least one of a segment of liner and a segment of the copper LM line isolated on at least one side by a "liner only" structure.

FIG. 1, described further below, depicts a cross-sectional view of such a structure.

Another exemplary fabrication sequence for forming a refractory element, can include the following steps:

1. lithographically patterning, etching, depositing a TaN/Ta liner, depositing copper and using chemical mechanical polishing (CMP) to damascene a last metal (LM) wiring level and fuses;
2. depositing a barrier nitride layer, preceded by pretreating with a standard plasma;
3. patterning wafers, opening up a fuse window, etching the nitride, etching copper selective to Ta; and
4. depositing a final passivation oxide/nitride, processing wafers through standard terminal via and laser blowing the fuse.

Figure 3:
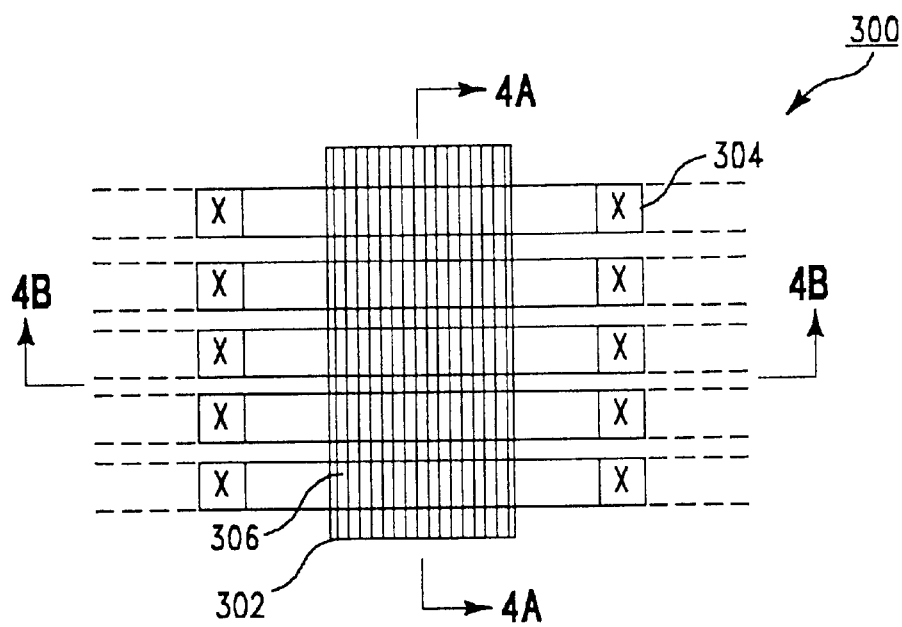
FIG. 3 depicts a top view of a copper fuse with the copper removed prior to fuse blow of the present invention.
Figure 4A:
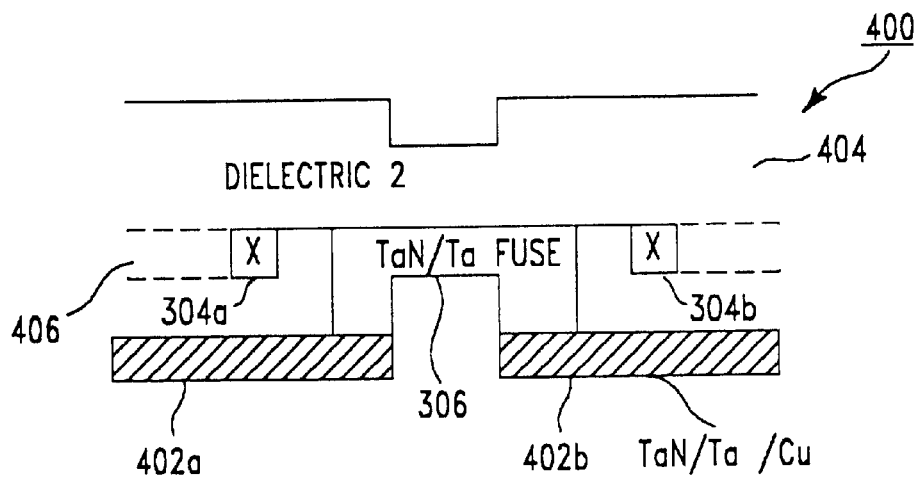
FIGS. 4A and 4B depict cross-sectional side views of the structure of the refractory, e.g., TaN/Ta fuse of the present invention.
Figure 4B:
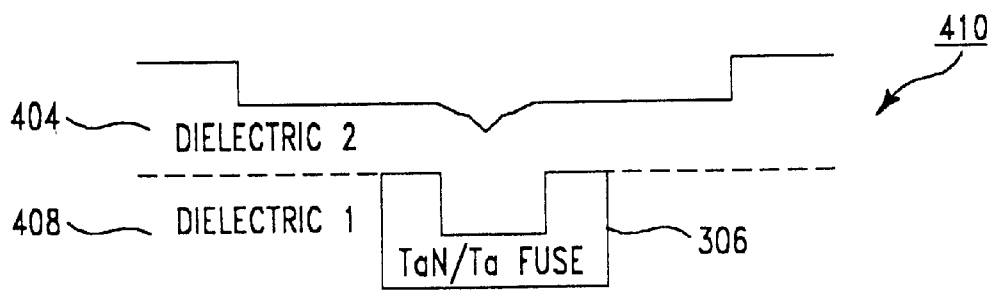

FIGS. 3, 4A and 4B, described further below, depict several cross-sectional views of a structure fabricating using this method.

The present invention eliminates the possibility of blown copper wiring fuses corroding by removing the copper from the fuse area before the final passivation layer is deposited on the wafer and the last metal (LM) bond pads are opened in the terminal via (TV) etch. This can be performed by adding an additional block mask level, immediately after LM CMP, patterning the fuse window, and removing the copper from the fuses. After copper removal, the final passivation can be deposited and the wafer can be run through the standard TV and fuse blow operations.

An advantageous feature of the present invention is that the laser deleted region is isolated from the remainder of the copper circuitry by links of fully passivated, corrosion resistant TaN/Ta. In one embodiment of the invention, the fuse can be a portion of the TaN/Ta link, and in another embodiment, the fuse can be an appropriately sized portion of a TaN/Ta/Cu line which is adjacent to the TaN/Ta links. The structure of the present invention intrinsically eliminates the possibility of spreading of deleted fuse associated corrosion into the chip wiring or bridging of the deleted region.

Another advantageous feature of the present invention is that the fully passivated, corrosion resistant TaN/Ta links can be used as resistors. The resistor structure has low capacitance, high resistance, is physically small, and has a high melting temperature.

Example Detailed Implementation of Specific Embodiments of the Present Invention FIGS. 1A through 1G depict a cross-section of an integrated circuit during fabrication of the fuse of the present invention. FIG. 2 depicts a flowchart 200 illustrating an example technique of fabricating the structure depicted in FIGS. 1A through 1G.

FIG. 2 begins with step 202 which can continue immediately with step 204. In step 204, a fuse line can be formed including a resist layer, an oxide layer and a last metal minus one (LM−1) layer. Specifically, the fuse line is formed by placing a resist layer over the previously deposited oxide layer. The oxide layer can include a material such as, e.g., silicon dioxide, deposited using conventional methods such as, e.g., plasma enhanced chemical vapor deposition (PECVD), over the previously deposited LM−1 layer. An example of the structure formed by step 204 is depicted in FIG. 1A.

Figure 2:
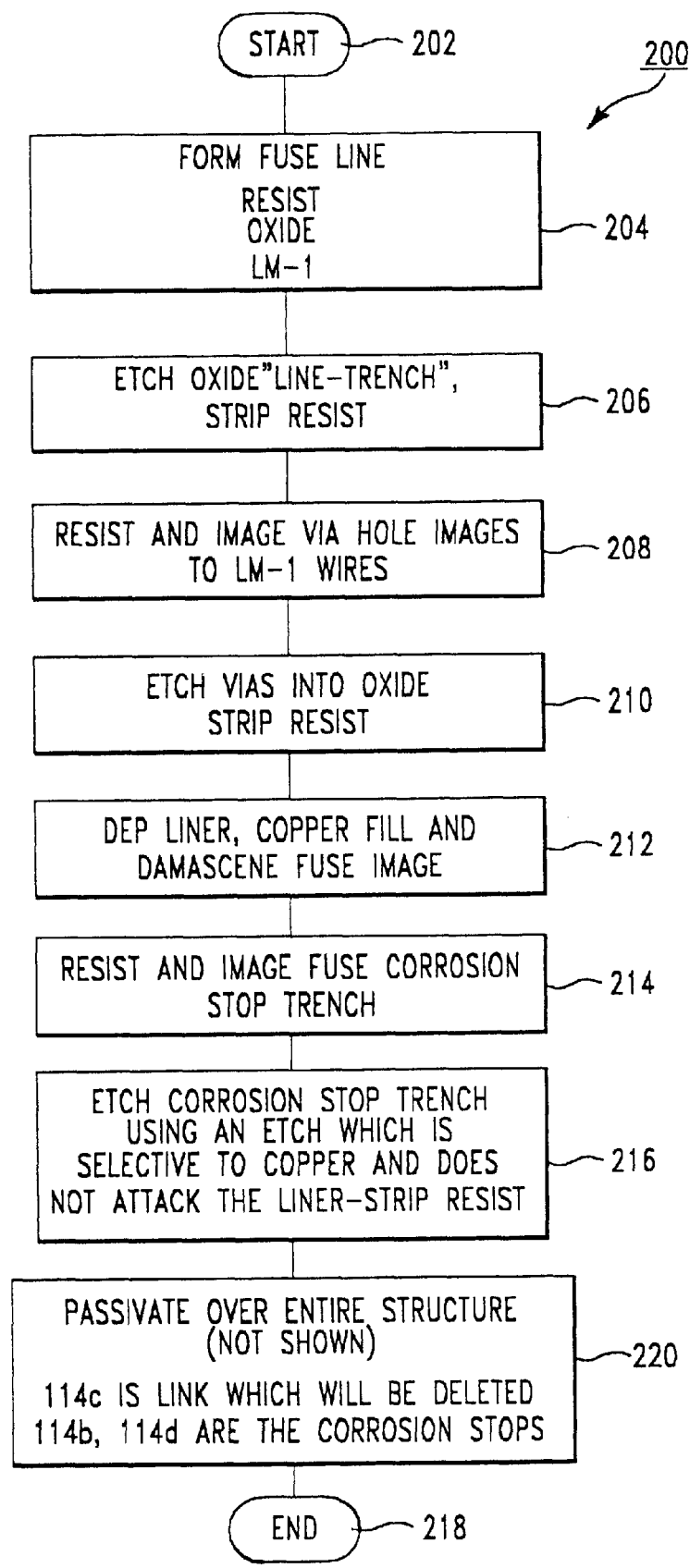
FIG. 2 depicts a flow diagram of the steps of an example process of the present invention.

FIG. 1A illustrates a semiconductor structure including resist segments 102a and 102b formed on an inter layer dielectric (ILD) oxide layer 106 which in turn can overlay last metal minus 1 (LM−1) layer segments 108a and 108b.

From step 204, flowchart 200 can continue with step 206. In step 206, the oxide layer can be etched to create a "line-trench," and the resist layer can be stripped. The structure formed by step 206 is depicted in FIG. 1B.

Figure 1B:
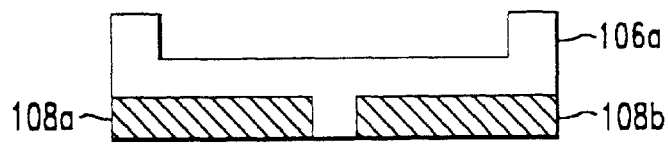

FIG. 1B illustrates the semiconductor structure of FIG. 1A following etching of the oxide layer 106, yielding oxide layer 106a including exemplary line trenches and pedestals. The line trench is formed in oxide layer 106a, by the stripping of resist segments 102a and 102b. LM−1 segments 108a and 108b remain, overlaid by the oxide ILD layer 106a.

Figure 1C:
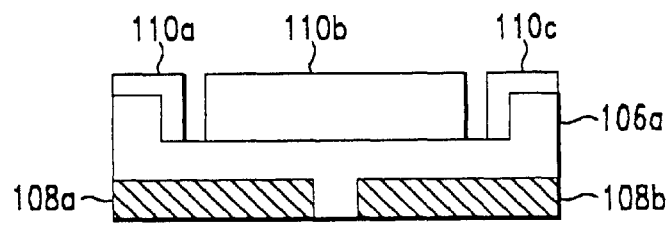

From step 206, flowchart 200 can continue with step 208. In step 208, resist can be applied and an image can be opened using a mask or reticle over resist leaving uncovered the portions where via holes are desired for connection to LM–1 layer wires. The resulting structure of the material is illustrated in FIG. 1C.

FIG. 1B illustrates the semiconductor structure of FIG. 1A following etching of the oxide layer 106, yielding oxide layer 106a including exemplary line trenches having generally horizontal bottom and vertical sides and ends surfaces.

Photoresist can be dispensed with a wafer structure stationary or rotating. A uniform resist thickness is preferred.

After resist coating is complete, the wafer can be transported to a softbake station which can bake by direct conduction at a specified temperature and time.

The resist film is sensitive to specific wavelengths of ultraviolet light (UV). The wafer/resist combination can be inserted into a mask aligner, which can contain optics, a UV light source, and the circuit layer image contained on a mask or reticle, which is to be transferred to the resist film.

A development step can form the mask image by selectively removing exposed (or unexposed) regions in the positive (or negative) photoresist film. Wafers can be cassette loaded onto a developer/hardbake track and can be sent to a developer station. Developer solution can be dispensed to flood the wafer, and the wafer can remain idle while development proceeds for a time, and then a spin/rinse cycle or cycles can complete the process. An alternate technique can employ a temperature controlled bath where wafers are batch developed using agitation.

From step 208, flowchart 200 can continue with step 210. In step 210, the oxide layer can be selectively etched away to create via holes in the oxide layer to the LM–1 layer, and the resist layer can then be stripped away. The resulting structure formed by step 210 is illustrated in FIG. 1D.

The patterned photoresist can expose the underlying material to be etched. The photoresist can be robust enough to withstand wet (acidic) and dry (plasma or reactive ion etching (RIE)) etching environments with good adhesion and image continuity, as well as the force of an implanter beam when used as an implantation mask.

Resist stripping can include complete removal of the photoresist after the masking process to prevent contamination in subsequent processes. There are many photoresist solvent (premixed) strippers available that will remove positive and negative photoresist (+PR and –PR) without adversely affecting the underlying material. A temperature controlled bath can be used for batch stripping of photoresist followed by appropriate rinsing. Ozone plasma($O_3$) can also be effective in removing photoresist.

Figure 1D:
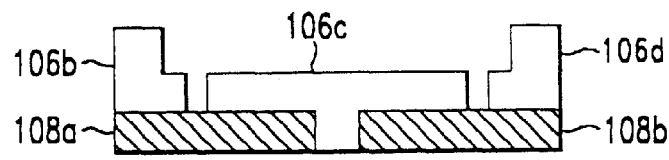

FIG. 1D illustrates the semiconductor structure of FIG. 1C following etching of oxide 106a, and stripping of resist segments 110a and 110b, creating oxide segments 106b, 106c and 106d separated by the etched via holes to LM–1 wire segments 108a and 108b.

From step 210, flowchart 200 can continue with step 212. In step 212, a liner can be deposited, copper metal can fill the trench and via holes using a damascene metallization process and a damascene fuse can be imaged. Metal is used in semiconductor processing for creating low resistance paths. Metal can be put down by the chemical vapor deposition (CVD) process or the physical vapor deposition (PVD) sputtering process. For example, using CVD, $WF_6$ can be used to deposit W. Copper can be deposited using a sputtering process or electroplating. Physical vapor deposition can be done by an evaporation metallization process and a sputtering deposition process. Copper deposition can be performed using Ta or TaN as a liner or barrier layer between Cu and Si. The lye resulting structure following damascene filling of the trench and vias with copper,as formed by step 212 is illustrated in FIG. 1E.

Figure 1E:
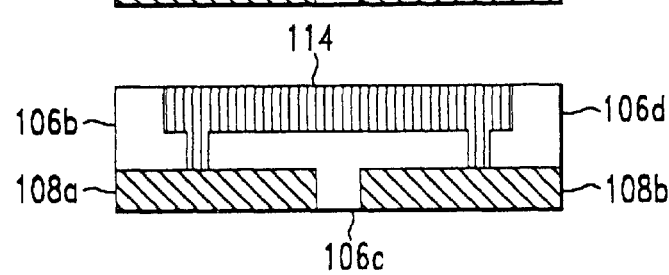

FIG. 1E illustrates the semiconductor structure of FIG. 1D following deposit of a liner in the trench, and metal filling 114 of the trench and vias to LM–1 segments 108a and 108b, formed by oxide segments 106b, 106c and 106d.

From step 212, flowchart 200 can continue with step 214. In step 214, resist can be applied and a fuse corrosion stop trench can be imaged to permit etching of the metal layer. The resulting structure formed by step 214 is illustrated in FIG. 1F.

Figure 1F:
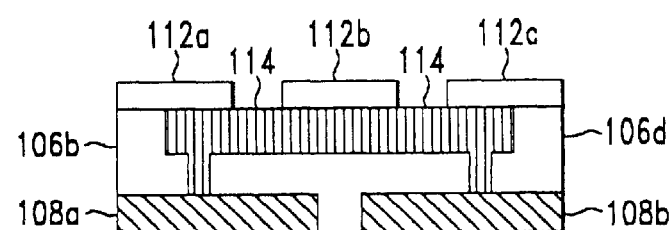

FIG. 1F illustrates the semiconductor structure of FIG. 1E following imaging of resist leaving unprotected the portions of damascene fill fuse 114, which will be etched to form the fuse corrosion stop trench. Resist segments 112a, 112b and 112c protect the underlying fuse 114 and oxide portions 106b and 106d.

Figure 1G:
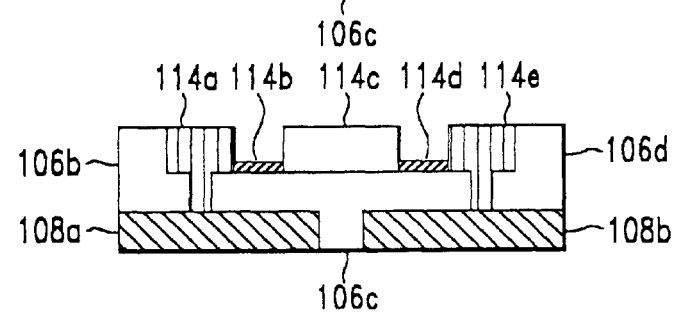

From step 214, flowchart 200 can continue with step 216. In step 216, the damascene fuse 114 can be etched to form corrosion stop trenches in the metal fuse by using an etchant which is selective to copper and does not attack the liner, and the resist can be stripped. Various etching techniques can be used including, e.g., wet etching and dry etching. Wet etching can use various mixtures of hydrofluoric acid and water (e.g., 10:1, 6:1, 100:1), and can include a buffering agent such as ammonium fluoride for a slower, more controlled etch rate. Although relatively inexpensive, wet etching can also lead to severe undercutting since it is an isotropic process, i.e. proceeding at nearly equal rates in all directions, which can make it impractical. To avoid encroachment, dry, or plasma etch technology, using, e.g., a glow discharge to ionize an inert gas (i.e. reactive ion etching (RIE) physical sputtering) can be used to set up very anisotropically (i.e. directional) etched features, providing for higher circuit densities. When multiple layers are involved in dry etching process, such as silicon nitride over silicon dioxide, it is important to know the relative etch rates of the two materials in the available etchants. This "selectivity" will determine if significant etching of underlying layers will occur. Plasma etch processes, since they are basically chemical by nature exhibit better selectivity as compared to RIE physical sputtering processes. The resulting structure formed by step 216 is illustrated in FIG. 1G. From step 216, flowchart can immediately end with step 218.

FIG. 1G illustrates the semiconductor structure of FIG. 1F following etching of the copper metal fuse using an etchant selective to copper which does not attack the liner and following stripping of the resist portions 112a, 112b and 112c, leaving copper segments 114a, 114c and 114e and thin corrosion stop trench portions of the remaining TaN/Ta liner segments 114b and 114d or stubs. The TaN/Ta stubs 114b and 114d are left exposed to the environment and do not corrode. Thus, rather than create only a single resistive element (as described further with respect to FIGS. 7–15, below), FIGS. 1A–1G depict forming a fuse 114c with a non-corrosive liner 114b and 114d on each side of the fuse. Following laser deletion of fuse line 114c (also removing the liner below segment 114c), liner stubs 114b and 114d remain. Since the stubs 114b and 114d are made of the liner material, TaN/Ta, i.e., are relatively highly resistive and refractory, they do not corrode, and thus regrowth cannot occur across the area where the fuse link 114c had previously been. The non-corrosive material, being resistive, can be used as a resistor as described further below, with reference to FIGS. 7–15. In some sense, the non-corrosive nature, i.e. the refractory features of the liner material, e.g., Ta, α-Ta, and TaN, makes it a good resistor. Specifically, if the material were instead corrosive, it would not be useful as a resistor since the resistivity would change with corrosion of the material.

FIG. 3 depicts a top view 300 of a copper fuse with the copper removed prior to fuse blow of the present invention. Top view 300 illustrates fuse bay 302 and fuse 306 and via holes 304.

FIGS. 4A and 4B depict cross-sectional side views of the structure of FIG. 3. FIG. 4A includes cross-sectional side view 400 including TaN/Ta fuse 306, via holes 304a and 304b, referred to as a bomb shelter, TaN/Ta/Cu portions 402a and 402b and dielectric 2 404. FIG. 4B includes cross-sectional side view 410 including TaN/Ta fuse 306, dielectric 1 408 and dielectric 2 404.

Figure 5:
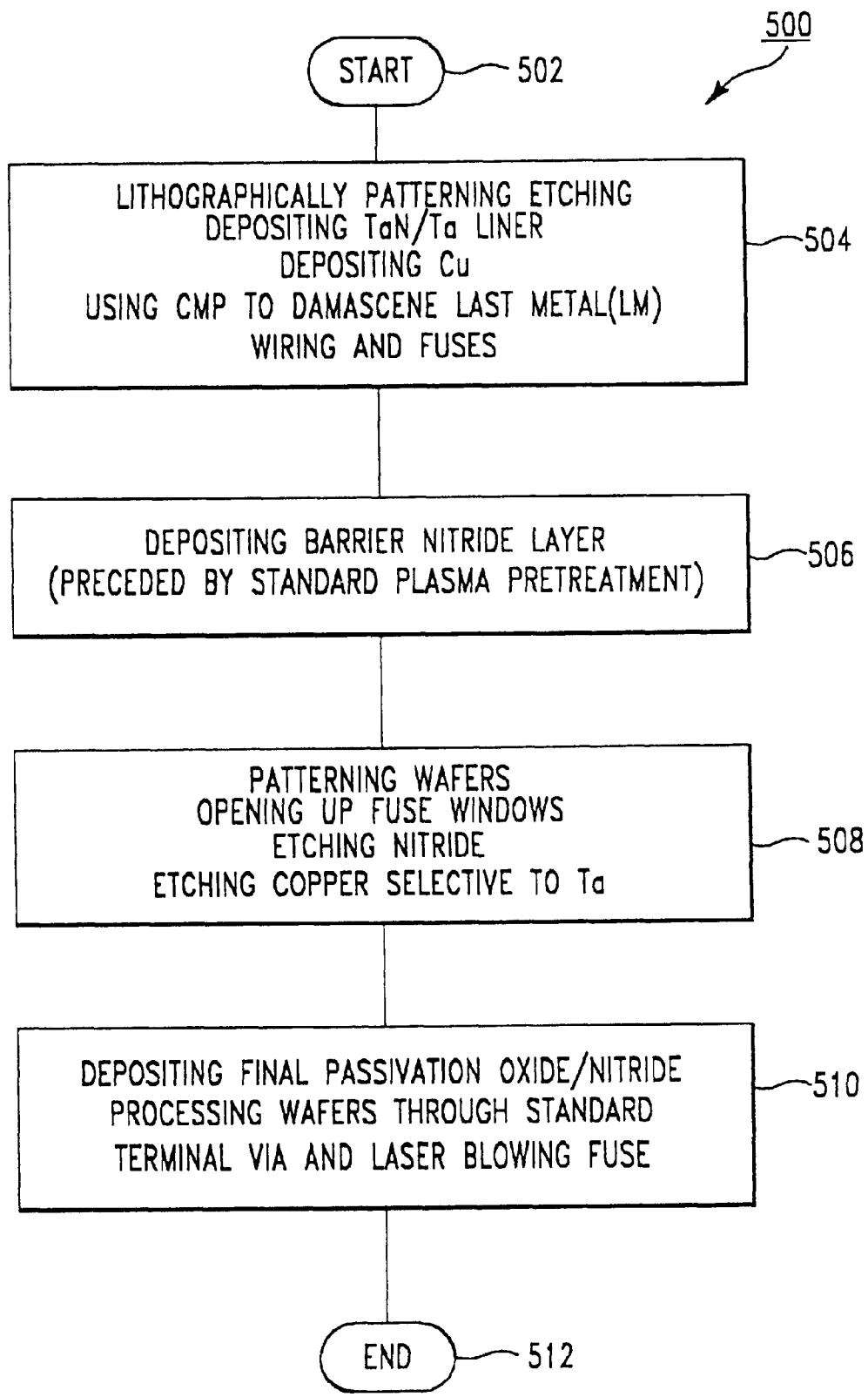
FIG. 5 depicts a flow diagram of the steps of an example process of the present invention.

FIG. 5 depicts a flow diagram 500 of the steps of an example fabrication sequence. Flow diagram begins with step 502 and can continue immediately with step 504.

In step 504, flow diagram 500 illustrates a step of lithographically patterning, etching, depositing a TaN/Ta liner, depositing copper and using chemical mechanical polishing (CMP) to damascene a last metal (LM) wiring level and fuses. From step 504, flow diagram 500 can continue with step 506.

In step 506, flow diagram 500 illustrates a step of depositing a barrier nitride layer, which can be preceded by a step of pretreating with a standard plasma. From step 506, flow diagram 500 can continue with step 508.

In step 508, flow diagram 500 illustrates a step of patterning wafers, opening up a fuse window, etching the nitride, and etching copper selective to Ta. From step 508, flow diagram 500 can continue with step 510.

In step 510, flow diagram 500 illustrates a step of depositing a final passivation oxide/nitride, processing wafers through standard terminal via and laser blowing the fuse. From step 510, flow diagram 500 can continue with step 512. And in step 512, flow diagram 500 can end.

The present invention eliminates the possibility of blown copper wiring fuses corroding by removing the copper from the fuse area before the final passivation layer is deposited on the wafer and the last metal (LM) bond pads are opened in the terminal via (TV) etch. This can be performed by adding an additional block mask level, immediately after LM CMP, patterning the fuse window, and removing the copper from the fuses. After copper removal, the final passivation can be deposited and the wafer can be run through the standard TV and fuse blow operations.

Figure 6:
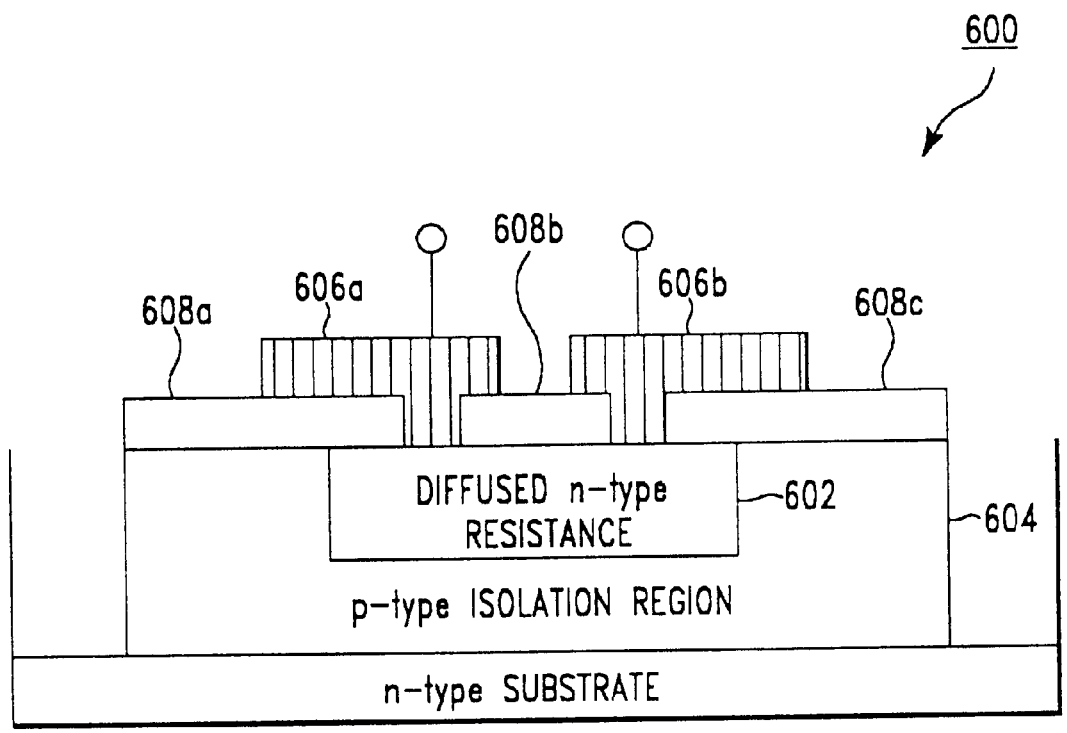
FIG. 6 depicts a cross-sectional view of a diffused n-type prior art resistance structure.

FIG. 6 depicts a cross-sectional view of a diffused n-type prior art resistance structure 600. Resistor structure 600 includes a n-type diffusion resistor 602, isolated by a p-type isolation region 604 from an n-type substrate. Deposited on diffused n-type diffusion resistor 602 are interconnects 606a and 606b separated by insulator segments 606a, 606b and 606c. The prior art resistor 602, typically used for resistor ballasting, has the disadvantages of higher capacitance, leakage, a temperature characteristic of the silicon itself and there can be breakdown phenomena to the substrate.

Figure 7A:
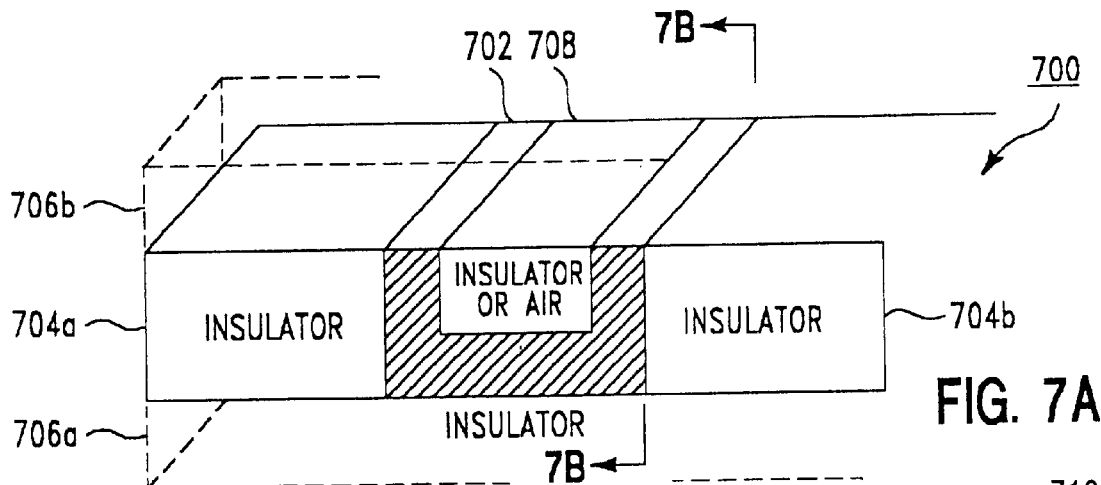
FIG. 7A depicts a cross-sectional view of a damascene resistor structure comprising a trough of the present invention.
Figure 7B:
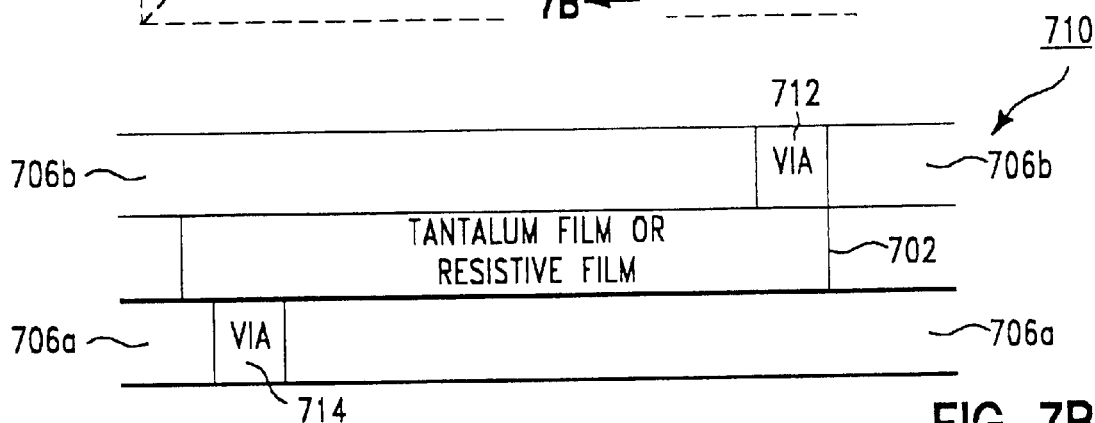
FIG. 7B depicts a cross-sectional side view of a dual-damascene resistor structure comprising a trough, via holes, and a plurality of dual-damascene films of the present invention.

FIG. 7A depicts a cross-sectional view 700 of an exemplary damascene resistor structure including trough of the present invention. Specifically, cross-sectional view 700 includes a trough 702 surrounded by insulator portions 704a, 704b, 706a and 706b. Cross-sectional view 700 includes a back end of line (BEOL) insulator that could be, e.g., a low K material, and silicon dioxide. The trench can be formed, e.g., by dry etching and standard back end processing. Then a liner material can be put down following an adhesive film, such as, e.g., tantalum nitride, followed by, e.g., a tantalum film. Copper can be deposited inside a cavity of the trench. In an embodiment of the invention, the copper can be removed, through a window. The trench of trough 702 can then be refilled with, e.g., an insulator 708 or can be left open to air. The copper is removed, in order to give the material higher resistance. The liner, e.g., Ta, α-Ta, TaN, acts as the effective resistor structure, see FIG. 7B. The tantalum film can be a single damascene or dual-damascene structure as depicted in FIG. 7B. The copper also has a lower melting temperature than the tantalum film and thus can be more prone to failure when the structure heats up. The thermal properties differ depending upon the filler. It will be apparent to those skilled in the art, that insulators 706a and 706b can include other materials such as, e.g., a metal or a dielectric layer. By filling the trench with high dielectric material, ESD robustness improves. The power to failure of an insulator improves robustness over air. The advantage of air is that it is non-corrosive and dissipates heat by heat transfer to the upper layers or regions.

In a thermal diffusion timescale, when a volume of trench 702 is refilled with insulator 708, the thermal sheath formed by the insulator is advantageous, since the power to failure improves with the fact that there is insulator in the volume, relative to the case of air. The thermal properties then can change whether the cavity is filled or left unfilled. Other low capacitance (K) materials or $SiO_2$ can be used. If refilled with a high dielectric material, like $SiO_2$, the thermal robustness of the resistor improves and the ESD robustness improves. In the case of air, it is physically lower. When filled with a high K dielectric material, there is a higher power to failure robustness, i.e., there is a higher critical current to failure. By using an insulator, rather than filling the trench with copper, it creates a higher resistivity and lowers the melting point. The trench 702 can be made of TaN/T film material, i.e., the same liner material used in forming the non-corrosive fuses described with reference to FIGS. 3, 4A and 4B.

FIG. 7B depicts a cross-sectional side view 710 of an exemplary dual-damascene resistor structure comprising a trough, via holes, and a plurality of dual-damascene films of the present invention. Specifically, cross-sectional view 700 includes a dual-damascene resistor structure 702 comprising a trough 702 comprising dual-damascene films such as, e.g., a tantalum film and a resistive film, and via holes 712 and 714. Other materials can be included in the layers such as insulators 706a and 706b.

Figure 7C:
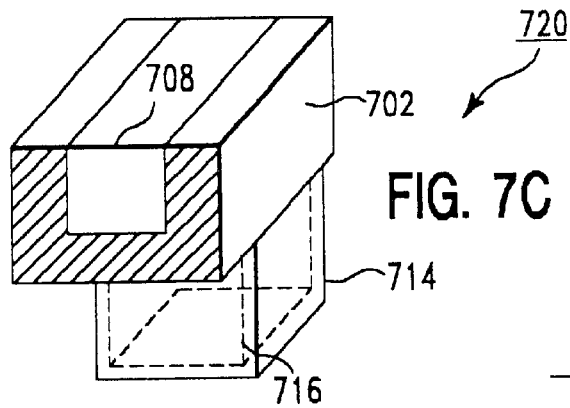
FIG. 7C depicts another cross-sectional view of a dual-damascene resistor structure comprising a trough, a via hole, and a film filled with an insulator of the present invention.

FIG. 7C depicts another cross-sectional view 720 of a dual-damascene resistor structure 702 comprising trough 702 including a the film trough and filled with insulator 708, via 714, filled in with insulator 716 and a via film.

Figure 7D:
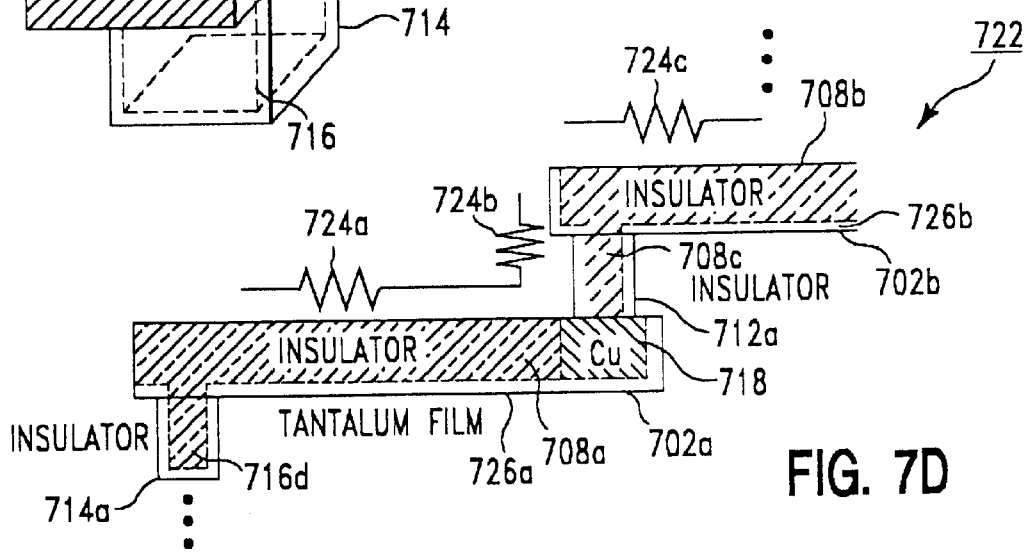
FIG. 7D depicts a cross-sectional side view of a dual-damascene resistor structure comprising a trough, a via hole, and a plurality of dual-damascene films of the present invention.

FIG. 7D depicts a cross-sectional side view 722 of a plurality of films, i.e., multiple single damascene or multiple dual-damascene films, forming multiple resistors in parallel. Specifically, in one embodiment, side view 722 includes a dual-damascene resistor structure comprising a trough 702a having a plurality of dual-damascene films 726a and 726b, and a via hole 712a and 714b. Trough 702a can be filled (as shown) in with insulator 726a and copper segment 718, and vias 714a and 712a are filled with insulators 716d and 708c, respectively. Each insulator segment of the troughs and vias act as resistive elements represented by resistors 724*a*, 724*b* and 724*c*.

FIG. 8 depicts an exemplary cross-sectional view 800 of an example resistor structure comprising a dual-damascene trough 802 in an upper layer, a single damascene single trough 810 in a lower layer, coupled by a via hole 806. Where copper is removed to form a cavity, oxide, for example, can be used to fill in the cavity. Dual-damascene trough 802 can be filled with an oxide material 804. Single damascene trough 810 can include an insulator filling portion 812 and a copper portion 814 connecting insulator 812 to via 806 which in turn can be filled with an oxide filler portion 808. Copper 814, a good conductor connects insulator 812 and oxide 808 similar to coupling two resistors 816*a* and 816*b* together, in series. Oxide 804 can act as a resistor 816*c*, as shown.

FIG. 9 depicts an exemplary cross-sectional view 900 of a example dual-damascene resistor structure comprising a trough 902 in an upper layer, a single damascene single trough 810 in a middle layer, coupled by a via hole 906, and a tungsten (W) M0 wiring level 920 coupled to middle damascene 910 by a via 918 which can include a W filler. Tungsten (W) has a high melting temperature, it can be used as a local interconnect, at the so-called M0 local interconnect level, against the silicon dioxide, i.e., in the silicon surface. The Tungsten material can be used as a resistor in parallel with the other resistor materials. Thus a series of a plurality of refractory metal surfaces can be used to form a resistor structure on multiple levels. The dual-damascene trough 902 can be filled with an oxide material 904. Single damascene trough 910 can include an insulator filling portion 912 and a copper portion 914 connecting insulator 912 to an oxide filled portion 908 of via 906. Copper 914, a good conductor can connect insulator 912 and oxide 908 similar to coupling two resistors 916*a* and 916*b* together, in series. Oxide 904 can act as a resistor 916*c*, as shown.

Figure 10:
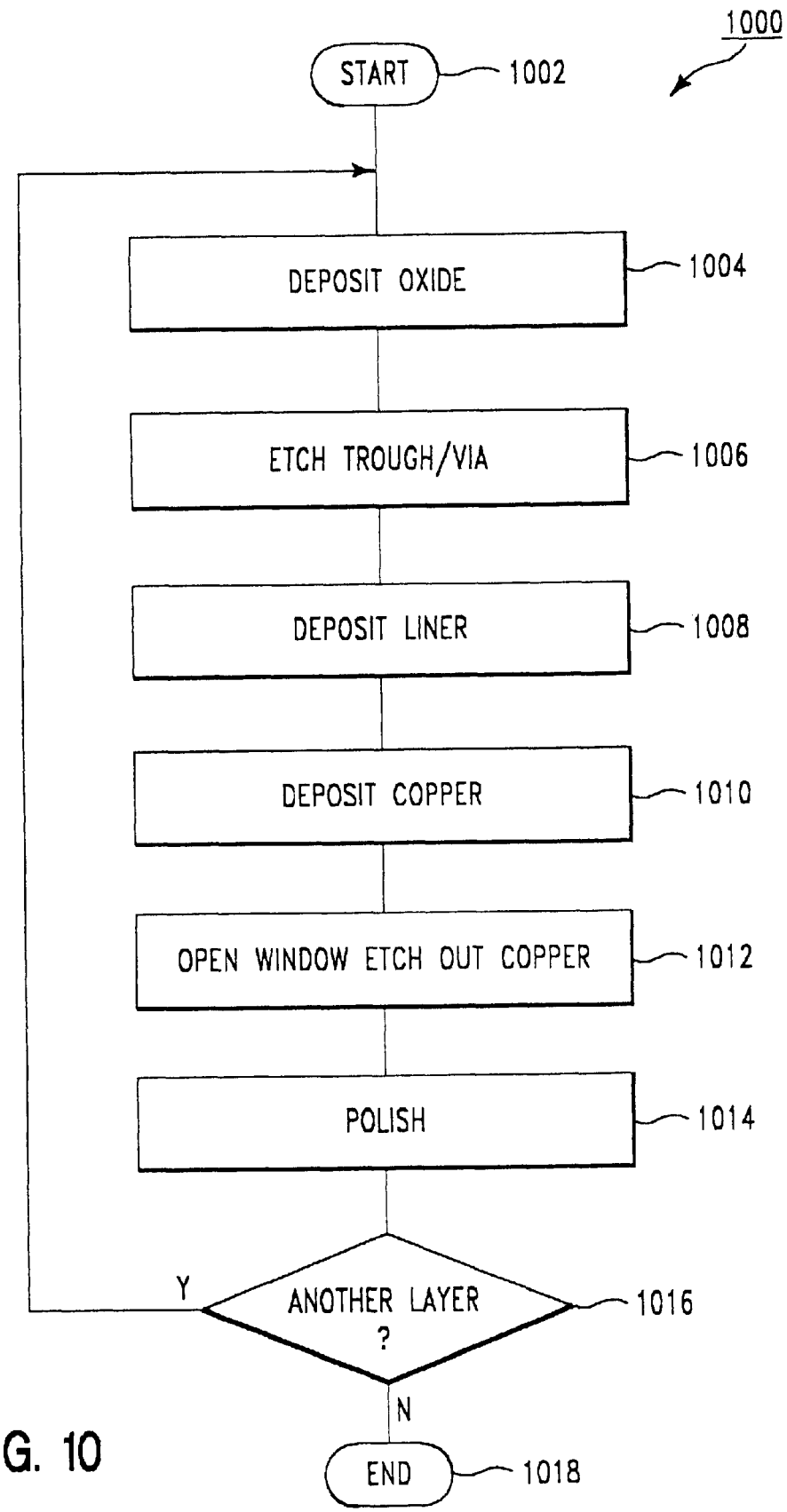
FIG. 10 depicts a flow diagram illustrating an exemplary process of forming a resistor structure of the present invention.

FIG. 10 depicts a flow diagram 1000 illustrating an exemplary process of forming a resistor structure in an embodiment of the present invention.

Flow diagram 1000 begins with step 1002 and can continue immediately with step 1004.

In step 1004, an oxide layer can be deposited. From step 1004, flow diagram 1000 can continue with step 1006.

In step 1006, a trough or trench and via can be etched in the oxide layer previously deposited forming trench 702, above. From step 1006, flow diagram 1000 can continue with step 1008.

In step 1008, a liner can be deposited. From step 1008, flow diagram 1000 can continue with step 1010.

In step 1010, a copper metal layer can be deposited. From step 1010, flow diagram 1000 can continue with step 1012.

In step 1012, a window can be opened and the copper can be etched out. From step 1012, flow diagram 1000 can continue with step 1014.

In step 1014, the resulting structure can be polished to planarize the resulting metallic structure. From step 1014, flow diagram 1000 can continue with step 1016.

In step 1016, it can be determined whether another layer will be deposited. If another layer is to be deposited, then flow diagram can continue with step 1004. If no other layer is to be deposited, then from step 1016, flow diagram 1000 can immediately end with step 1018.

Figure 11:
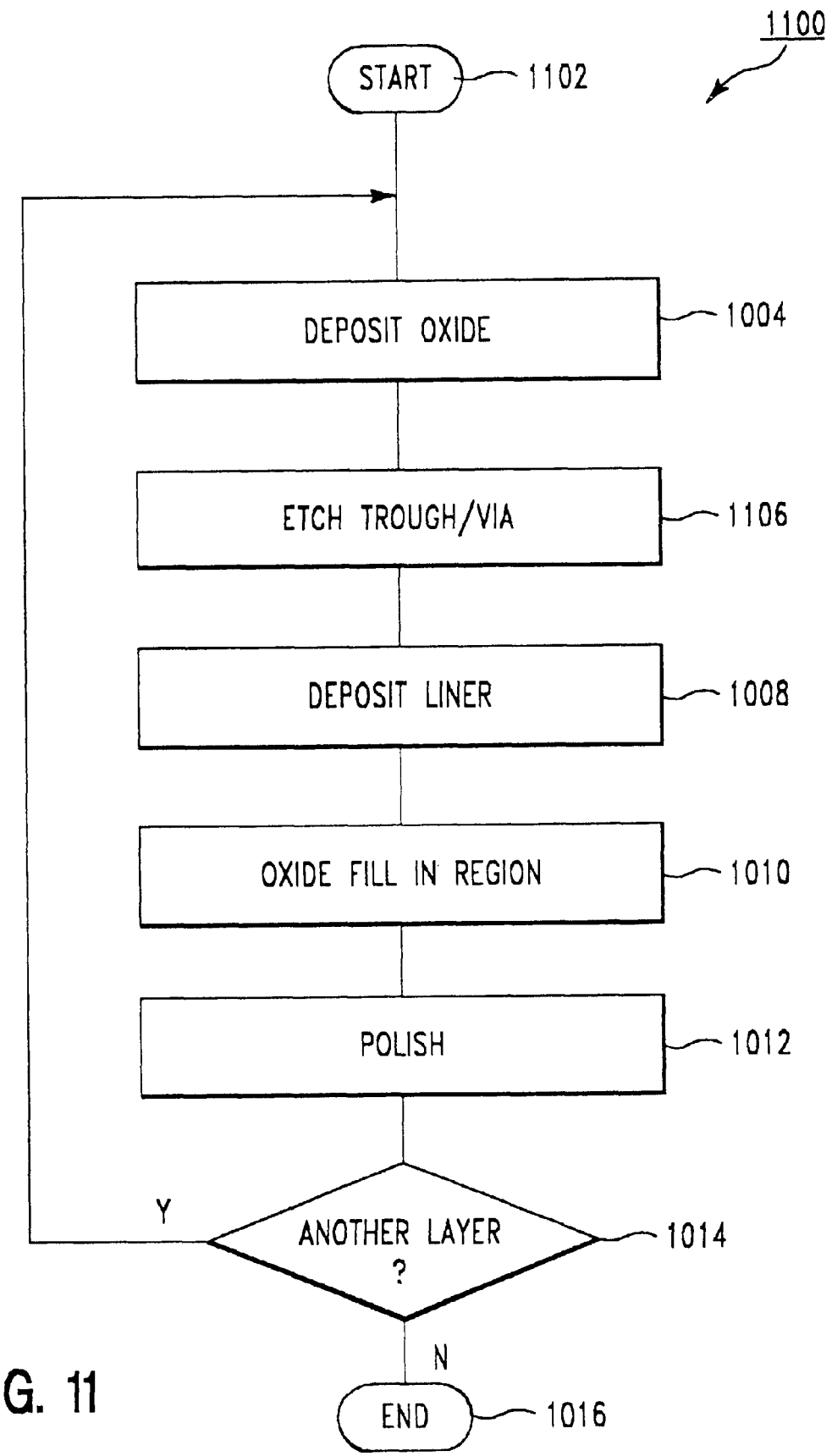
FIG. 11 depicts a flow diagram illustrating another exemplary embodiment of a process of forming a resistor structure of the present invention.

FIG. 11 depicts a flow diagram 1100 illustrating another exemplary embodiment of a process of forming a resistor structure in another embodiment of the present invention.

Flow diagram 1100 begins with step 1102 and can continue immediately with step 1104.

In step 1104, an oxide layer can be deposited. From step 1104, flow diagram 1100 can continue with step 1106.

In step 1106, a trough or trench and via can be etched in the oxide layer previously deposited forming trench 702, above. From step 1106, flow diagram 1100 can continue with step 1108.

In step 1108, a liner can be deposited. From step 1108, flow diagram 1100 can continue with step 1110.

In step 1110, the region can be filled in with an oxide dielectric. From step 1110, flow diagram 1100 can continue with step 1112.

In step 1112, the resulting structure can be polished to planarize the resulting metallic structure. From step 1112, flow diagram 1100 can continue with step 1114.

In step 1114, it can be determined whether another layer will be deposited. If another layer is to be deposited, then flow diagram can continue with step 1104. If no other layer is to be deposited, then from step 1114, flow diagram 1100 can immediately end with step 1116.

Thus, the cavity can be left open to the air, to leave the fuse structure discussed with reference to FIG. 1, above, or the cavity can be refilled with oxide for a multiple level structure, so one can keep depositing more films above.

Figure 12A:
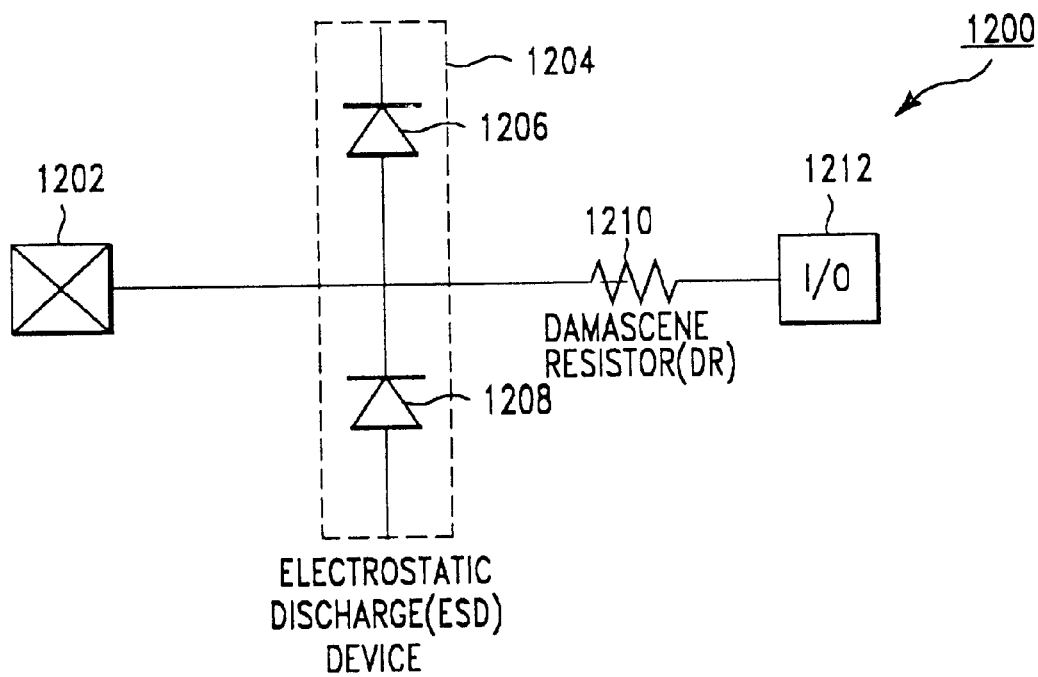
FIG. 12 illustrates an example circuit containing a damascene resistor, an ESD network, and a peripheral circuit using the present invention.
Figure 12B:
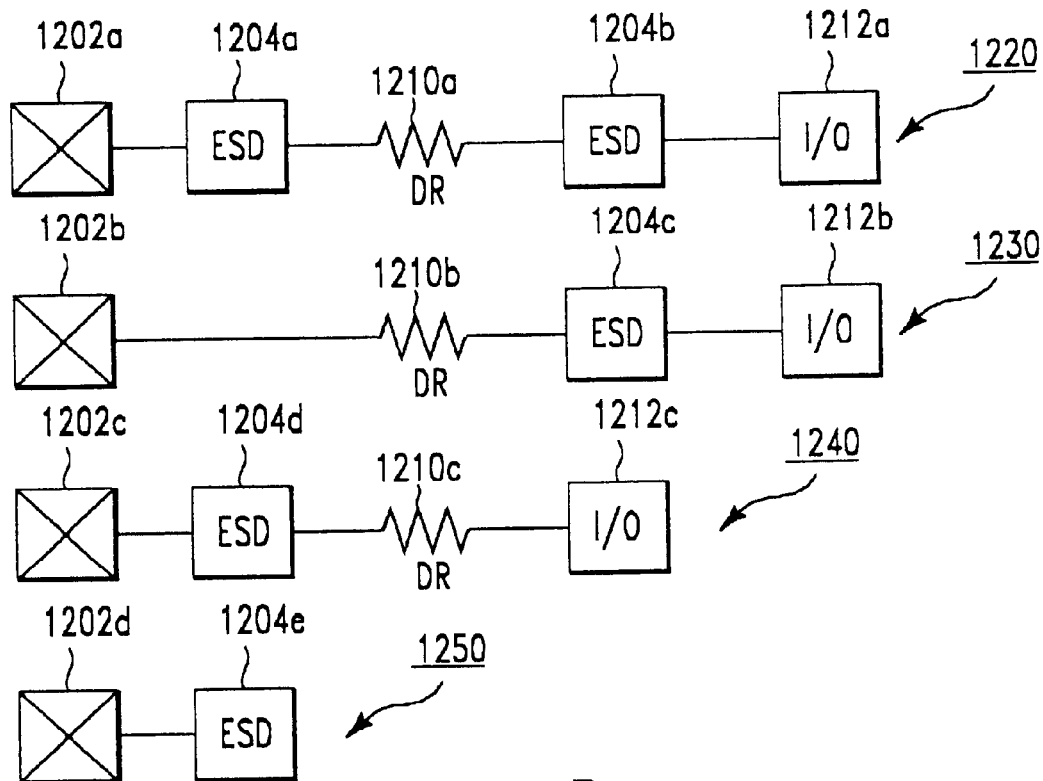

FIG. 12 illustrates an example circuit 1200 containing a pad 1202 coupled to an ESD device 1204 (i.e., a double diode circuit including diodes 1206 and 1208), a damascene resistor structure 1210, and a peripheral I/O network circuit 1212 using the present invention. Damascene wire resistor 1210 can include a single damascene or dual-damascene refractory metal film resistor structure as already illustrated.

Another embodiment of the invention illustrates example circuit 1220 including a pad 1202*a* coupled to an ESD device 1204*a*, coupled to a damascene resistor structure 1210*a*, coupled to an ESD device 1204*b*, and a peripheral I/O network circuit 1212*a* coupled to the ESD device 1204*b*.

Another embodiment of the invention illustrates example circuit 1230 including a pad 1202*b* coupled to a dual-damascene 10- resistor structure 1210*a* coupled to an ESD device 1204*c*, and a peripheral I/O network circuit 1212*b* coupled to the ESD device 1204*c*. This embodiment includes the advantage of ring back, noise reflection, and is useful for dampening mechanisms.

Another embodiment of the invention illustrates example circuit 1240, including a pad 1202*c* coupled to an ESD device 1204*d*, coupled to a damascene resistor structure 1210*c*, and a peripheral I/O circuit 1212*c* coupled to the damascene resistor 1210*c*. It will be apparent to those skilled in the art, that circuit 1200 is a specific example of generic circuit 1240.

Another embodiment illustrates example circuit 1250 including a pad 1202*d* coupled to ESD circuit 1204*e*.

Figure 13A:
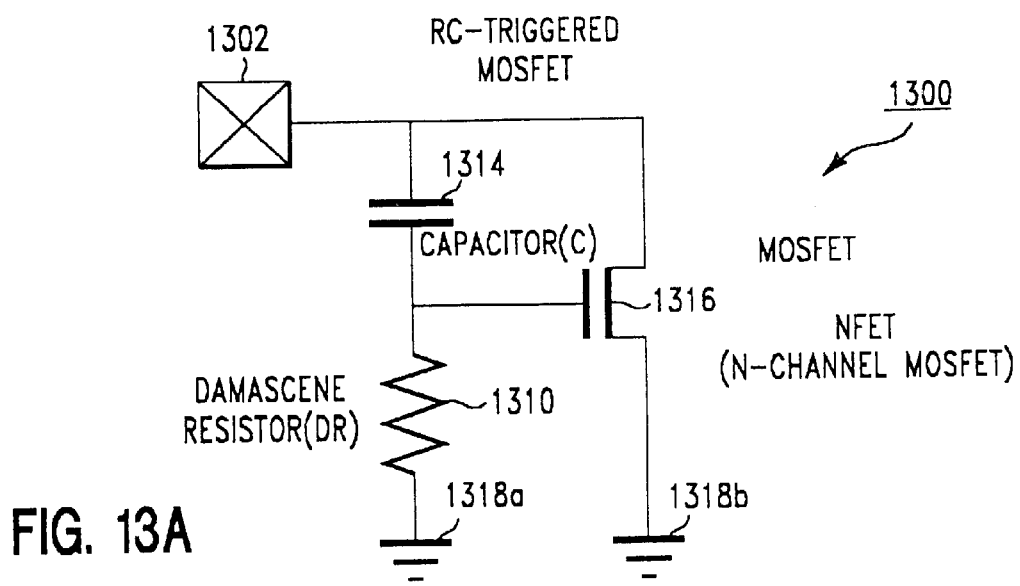
FIG. 13 illustrates an example circuit containing a damascene resistor (DR) as part of an RC triggered MOSFET network using the present invention.
Figure 13B:
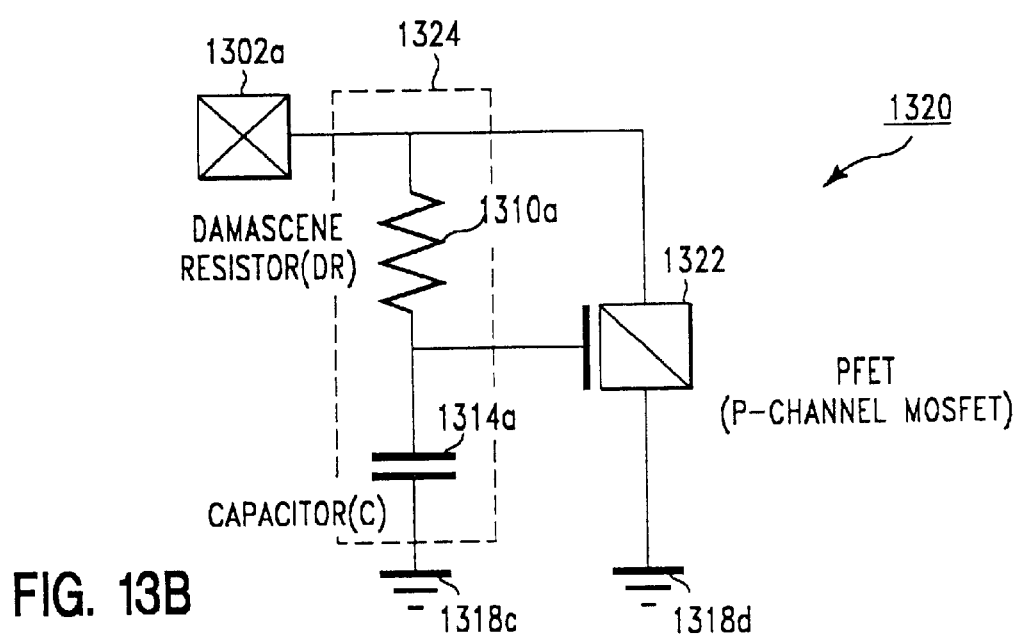

FIG. 13 illustrates an example circuit 1300 containing a damascene resistor 1310 as part of an ESD circuit. Exemplary circuit 1300 illustrates the damascene resistor 1310 as part of an RC-triggered MOSFET network. Circuit 1300 can include a pad 1302 coupled to a plate of a capacitor 1314, coupled to both, a terminal of grounded damascene resistor 1310 (see ground 1318*a*) and a gate of a MOSFET 1316, where a drain of the MOSFET 1316 is coupled to the pad 1302, and a source of the MOSFET 1316 is grounded to ground 1318*b*. Alternate embodiment 1320 illustrates a damascene resistor (DR) 1310*a* coupled to both a pad 1302*a* and a plate of a grounded capacitor (C) 1314*a* (coupled to ground 1318c). DR 1310a and C 1314a, collectively referred to as DR and C 1324, where coupled to one another, are also coupled to a gate of p-type MOSFET (PFET) 1322, whose source is coupled to pad 1302a and drain is grounded to a ground 1318d.

Figure 14:
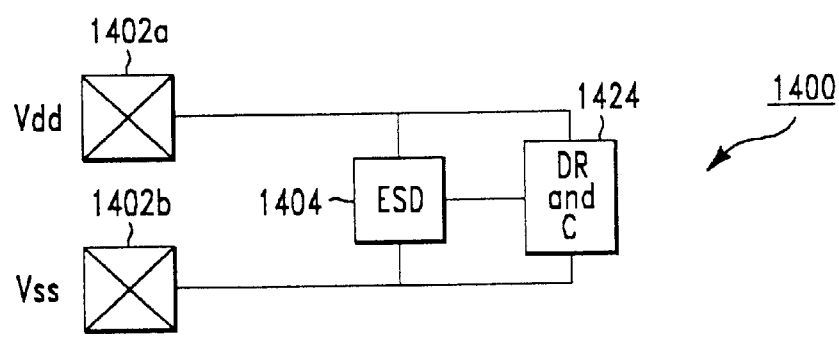
FIG. 14 illustrates an example circuit containing a damascene resistor as part of an RC triggered ESD Power Clamp using the present invention.

FIG. 14 illustrates an example circuit 1400 containing a damascene resistor as part of an RC triggered ESD Power Clamp, including an DR and C 1424, coupled to an ESD circuit 1404, which is coupled to $V_{dd}$ 1402a and $V_{SS}$ 1402b.

In general then, the wire resistor can be used as a circuit element to an ESD circuit, as a circuit element inside the core of the chip, in peripheral circuits, and in ESD networks.

FIG. 15 illustrates an example circuit 1500 containing a damascene resistor 1508 on a contact level in series with a MOSFET to provide local resistor ballasting with respect to contact holes. Trench 1508 is shown etched from a copper wire and liner 1512, filled with an insulator 1510. Trench 1508 is connected to the MOSFET by a via of W 1506, also known as a plug. The MOSFET includes n-type regions 1502a and 1502b and polysilicon portion 1504. FIG. 15 includes example circuits including multi-finger MOSFET structures. The MOSFET can be, e.g., a pull-down transistor in a MOSFET driver, or an ESD network. By adding local resistor elements on the contact level, the present invention provides parallel resistors going into even a single finger MFET, or if replicated can include a plurality of NFETs providing resistor ballasting in that dimension as well. Exemplary circuit schematic diagram 1520 includes a pad 1514a coupled to the source interconnections of MOSFETs 1518a and 1518b by DRs 1516a and 1516b, respectively. The gates of MOSFETs 1518a and 1518b are tied together. In another embodiment, exemplary circuit schematic diagram 1530 includes a pad 1514b coupled to source nodes of MOSFETs 1518c, 1516d and 1518e. The drain nodes of MOSFETs 1518c, 1518d and 1518e are coupled to interconnections of DRs 1516c, 1516d and 1516e, respectively. The gates of MOSFETs 1518c, 1518d and 1518e are tied together. Each of MOSFETs 1518c, 1518d and 1518e and its associated DRs 1516c, 1516d and 1516e, are referred to collectively as fingers 1522. The present invention can be useful in high current phenomena.

The physical structures of the fuses and the way that wires fuse for electrostatic discharge (ESD) protection. Use of the invention for fuses is known as personalization, or taking out circuits. The application of the present invention to ESD, is an application that attempts to avoid current overload of a network. The present invention as described above with reference to FIGS. 1–5, forms a structure which is a resistor, by creating a trough in oxide, filling the trough with a refractory metal, i.e. the tantalum nitride/tantalum and copper, and then etching away a portion of the copper, forming a short segment, which is only TaN/Ta, i.e., the resistor of FIGS. 7–15. It is useful as a fuse since it eliminates the possibility of corrosion of deleted copper wiring. When laser deleting a segment of a copper fuse line with associated liner, the ends of the cut can still have copper exposed to, e.g., atmosphere. Copper is very reactive, so it can corrode very easily. Since the corrosion mechanism for copper is typically dendritic growth, undesirable reconnection of the fuse is possible. To avoid corrosion then, the present invention can make the exposed portion of the blown fuse the non-reactive TaN/Ta.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A metal structure formed in a trough on a semiconductor substrate, said trough having sides, a bottom and ends, comprising:

a first portion of said structure comprised of a first layer and a second layer, said first layer being formed on the sides, bottom and ends of said trough, said first layer having higher electrical resistivity than said second layer, said second layer having horizontal and vertical surfaces that are in contact with said first layer in said first portion; and a second portion of said structure adjacent and coupled to said first portion, said second portion being comprised of said first layer, said first layer in said second portion not being in contact with said horizontal and said vertical surfaces of said second layer in said second portion.

2. The metal structure according to claim 1, wherein said first layer has a non-corrosive nature preventing regrowth of blown fuses.

3. The metal structure according to claim 1, wherein said first layer comprises a liner material.

4. The metal structure according to claim 1, wherein said first layer comprises a refractory material.

5. The metal structure according to claim 4, wherein said refractory material comprises at least one of Ta, α-Ta, TaN, and TaN/Ta.

6. The metal structure according to claim 1, wherein said first layer acts as a resistor.

7. A metal structure formed in a trough on a semiconductor substrate, said trough having sides, a bottom and ends; comprising:

a refractory material deposited on at least the sides and bottom of said trough; and a non-refractory conductive material filling at least one end of said trough, contacting only a portion said refractory material in said trough.

8. The metal structure according to claim 7, further comprising an interlevel via in contact with said trough.

9. The metal structure of claim 7, wherein said refractory material comprises at least one of Ta, α-Ta, TaN, and TaN/Ta.

10. The metal structure of claim 7, wherein said refractory material acts as a non-corrosive liner to prevent regrowth of blown fuses.

11. The metal structure of claim 7, wherein said refractory material is used as a resistor.

* * * * *